(12) United States Patent
Freeman (10) Patent No.: US 10,661,869 B2
(45) Date of Patent: May 26, 2020

(54) ACOUSTICALLY STEALTHY SOFT-BODIED UUV PROPULSION SYSTEM

(71) Applicant: The Government of the United States of America, as represented by the Secretary of the Navy, Arlington, VA (US)

(72) Inventor: Simon E. Freeman, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/218,239

(22) Filed: Dec. 12, 2018

(65) Prior Publication Data

US 2019/0176946 A1 Jun. 13, 2019

Related U.S. Application Data

(60) Provisional application No. 62/597,675, filed on Dec. 12, 2017.

(51) Int. Cl.
| | |
|---|---|
| *B63H 1/36* | (2006.01) |
| *B25J 9/06* | (2006.01) |
| *B63G 8/00* | (2006.01) |
| *B63G 8/08* | (2006.01) |
| *B25J 9/10* | (2006.01) |
| *H01L 41/09* | (2006.01) |
| *H01L 41/193* | (2006.01) |
| *B63H 21/17* | (2006.01) |

(52) U.S. Cl.
CPC .................. *B63H 1/36* (2013.01); *B25J 9/06* (2013.01); *B25J 9/1075* (2013.01); *B63G 8/001* (2013.01); *B63G 8/08* (2013.01); *B63H 21/17* (2013.01); *H01L 41/09* (2013.01); *H01L 41/193* (2013.01); *B63G 2008/002* (2013.01); *B63G 2008/004* (2013.01)

(58) Field of Classification Search
CPC . B63G 8/00; B63G 8/001; B63G 8/04; B63G 8/08; B63H 1/00; B63H 1/36; B25J 9/00; B25J 9/06; B25J 9/10; B25J 9/1075
USPC ................................ 440/13, 14, 15; 416/81
See application file for complete search history.

(56) References Cited

U.S. PATENT DOCUMENTS

| | | | | | |
|---|---|---|---|---|---|
| 3,091,210 | A | * | 5/1963 | Akutowicz | ............... B63H 1/36 416/81 |
| 6,138,604 | A | * | 10/2000 | Anderson | ................ B63G 8/08 440/15 |

(Continued)

*Primary Examiner* — Lars A Olson
(74) *Attorney, Agent, or Firm* — US Naval Research Laboratory; Richard Bis (57) ABSTRACT

An acoustically stealthy, soft-bodied underwater propulsion system includes a central chord member and a series of successive muscle layers each having a skeletal mechanism and a set of actuators. Each skeletal mechanism includes a central vertebra, two or more actuator arms extending radially outward from the central vertebra and disposed axially symmetrically about the central chord member, and an actuator plate extending from a radially outward end of each actuator arm and oriented substantially transverse to the actuator arm. Each actuator is situated between an actuator plate from a first muscle layer of the series and a second muscle layer of the series.

16 Claims, 7 Drawing Sheets

(56) References Cited

U.S. PATENT DOCUMENTS

| | | | |
|---|---|---|---|
| 6,835,108 B1 * | 12/2004 | Gieseke | B63H 1/36 |
| | | | 440/14 |
| 8,323,062 B2 * | 12/2012 | Bannasch | B63H 1/36 |
| | | | 440/15 |
| 9,032,900 B2 * | 5/2015 | Glezer | B63G 8/08 |
| | | | 114/321 |
| 9,090,320 B2 * | 7/2015 | Rufo | B63H 1/36 |
| 9,937,986 B1 * | 4/2018 | Oh | B63H 1/36 |

* cited by examiner

ACOUSTICALLY STEALTHY SOFT-BODIED UUV PROPULSION SYSTEM

RELATED APPLICATIONS

This application claims the benefit of U.S. Provisional Application No. 62/597,675 filed Dec. 12, 2017, which is hereby incorporated herein by reference.

FIELD OF INVENTION

The present invention relates generally to underwater vehicles, and more particularly to biomimetic underwater vehicles.

BACKGROUND

Soft robotics and electro-active polymers are emerging fields that could revolutionize autonomous undersea platforms. Cutting-edge Unmanned Underwater Vehicle (UUV) speed, range, and stealth are limited by:
1. Noisy and inefficient propulsion mechanisms such as propellers and rotating machinery that produce more easily detected 'tonal' noise.
2. Suboptimal hydrodynamics and propulsion modes that limit the speed at which acoustic measurements can be taken, in addition to limiting endurance and consequently survey area.
3. Structural impedance mismatch due to the use of syntactic foam and hollow pressure vessels that efficiently reflect acoustic waves.
4. Shallow-water and un-surveyed environments that introduce the risk of catastrophic collision damage.
5. Limitations to battery energy density.

SUMMARY OF INVENTION

Previous work has demonstrated the potential of biomimetic propulsion systems as a more efficient alternative to rotating machinery in motivating UUV-sized submerged vehicles. In order to traverse seasonally productive regions while avoiding predation, solitary pelagic fishes such as sailfish and marlin face strong evolutionary selection pressure when transiting inter-ocean distances quickly and stealthily using as little energy as possible. Consequently, their propulsive and hydrodynamic structures, in addition to behavior, are optimized to achieve goals that are similar to what is desired in covert UUV design: speed, range, and stealth.

There are hydrodynamic advantages to thunniform (rapid fish-like) swimming, micro-faceted surface treatments ('shark-skin'), and external body profiles. However, very little work has been performed on replicating the structural efficiencies of internal propulsive structures (musculature) or energy recovery systems (elastic ligaments) employed by pelagic fishes, let alone the integration of these components into a fully functional system. The gains in efficiency promised by biomimetic propulsion can only come about through adoption of all the stages of energy flow, from actuation to energy recovery, in addition to hydrodynamic optimization.

A soft robotics approach using elastic, electro-active polymers and flexible, tough thin-film batteries may replicate the high efficiencies seen in nature through complete mimicry of form and function, while increasing the ability of the UUV to withstand collisions and environmental damage. Soft robots are built using a modern variety of polymers, nanostructures, and other materials that deform reversibly when electrical current, differing temperatures, or other external energy is applied. These materials can be arranged to work in a manner similar to biological muscle: high-force linear contraction and relaxation, as opposed to rotational movement. Such actuation mechanisms possess tremendous potential for application in silent or near-silent propulsion systems because no rigid bearings or sliding rigid members may be required in their design.

While electo-active polymer science remains a rapidly advancing new field, a wide spectrum of performance already exists amongst currently available materials. Several possess key characteristics that are ideal for application to the high-force, low-displacement linear contraction desired in a biomimetic UUV. Dielectric elastomer actuators exert enough force and are reliable enough to have been trialed in industrial applications (pneumatic valves). Ionic polymer-metal composite (IPMC) materials such as perfluorinated alkene (i.e. Nafion™ by DuPont®) are manufactured in strip form, but may be arranged helically to replicate the contractive action required to accurately replicate thunniform movement. The helical arrangement of 'bending' materials has recently been shown to produce comparatively high levels of linear, tensile force.

In addition to improving speed and range, noise from thunniform movement is limited to broadband flow noise, which largely decays in an evanescent manner with distance from the source. In addition, these low-cost organic polymers may be tuned to match the impedance of water, creating an acoustically transparent propulsion system.

Therefore, presented herein is an unprecedented UUV that achieves high-speed endurance and simultaneously low self-noise for use as an acoustic sensing platform. Exemplary soft-bodied, truly biomimetic (both in a hydrodynamic and structural/energy recovery sense) autonomous vehicles replicate the cruise speeds, noise levels, stealth, and energy efficiencies of solitary, highly migratory pelagic organisms. Exemplary platforms travel quickly with low self-noise, while offering enhanced resistance to collision damage; goals that are difficult to achieve with conventional UUV designs.

According to one aspect of the invention, an acoustically stealthy, soft-bodied underwater propulsion system includes a central chord member and a series of successive muscle layers each having a skeletal mechanism and a set of actuators. Each skeletal mechanism includes a central vertebra, two or more actuator arms extending radially outward from the central vertebra and disposed axially symmetrically about the central chord member, and an actuator plate extending from a radially outward end of each actuator arm and oriented substantially transverse to the actuator arm. Each actuator is situated between an actuator plate from a first muscle layer of the series and a second muscle layer of the series.

Optionally, each actuator of the set of actuators comprises a standardized actuator cassette, each cassette including a stack of Dielectric Elastomer Actuator (DEA) layers.

Optionally, the vertebra member includes a ring circumscribing the chord member and wherein the chord member runs through successive vertebra members.

Optionally, each actuator arm is rigidly linked to a respective vertebra member.

Optionally, each actuator arm is rotatably linked to a respective vertebra member.

Optionally, each actuator arm is rigidly linked to a respective actuator plate.

Optionally, each actuator arm is rotatably linked to a respective actuator plate.

According to another aspect, an acoustically stealthy, soft-bodied underwater vehicle includes an oscillating foil at a rear end of the vehicle and a plurality of muscle layers configured to additively transmit force to the foil, the plurality of muscle layers arranged in overlapping, forward-facing cones with quadrilateral symmetry, thereby providing independent pitch and yaw axis control and inherent self-stabilization under tension, Each muscle layer comprises linearly contractile, ductile artificial muscles.

Optionally the artificial muscles comprise dielectric elastomer actuators.

Optionally, the acoustically stealthy, soft-bodied underwater vehicle includes a plurality of surface pressure sensors configured to provide feedback to a control unit, the control unit configured to provide fine-scale hydrodynamic control using the feedback from the surface pressure sensors.

Optionally, the oscillating foil includes an antenna in an upper half of the foil.

Optionally, the acoustically stealthy, soft-bodied underwater vehicle includes flexible circuit boards containing one or more control units configured to control the vehicle.

Optionally, the acoustically stealthy, soft-bodied underwater vehicle includes stacked, thin-film batteries configured to provide power to the plurality of muscle layers.

Optionally, the acoustically stealthy, soft-bodied underwater vehicle includes an electro-polymer actuation and energy recovery structure.

Optionally, the acoustically stealthy, soft-bodied underwater vehicle includes a forward projecting oil-filled hydrophone array enclosure.

Optionally, the oscillating foil is an ultra-high-aspect-ratio propulsion foil.

The foregoing and other features of the invention are hereinafter described in greater detail with reference to the accompanying drawings.

DETAILED DESCRIPTION

Discussion of the invention may start with a focus on a functional analogue of the simplest chordate, approximated by the extant Lancelet body form. The Lancelet may be viewed as a single flexible appendage made from repeating, independently controlled structures that permit a fine degree of geometric control, with the option of high power output when required.

Figure 1:
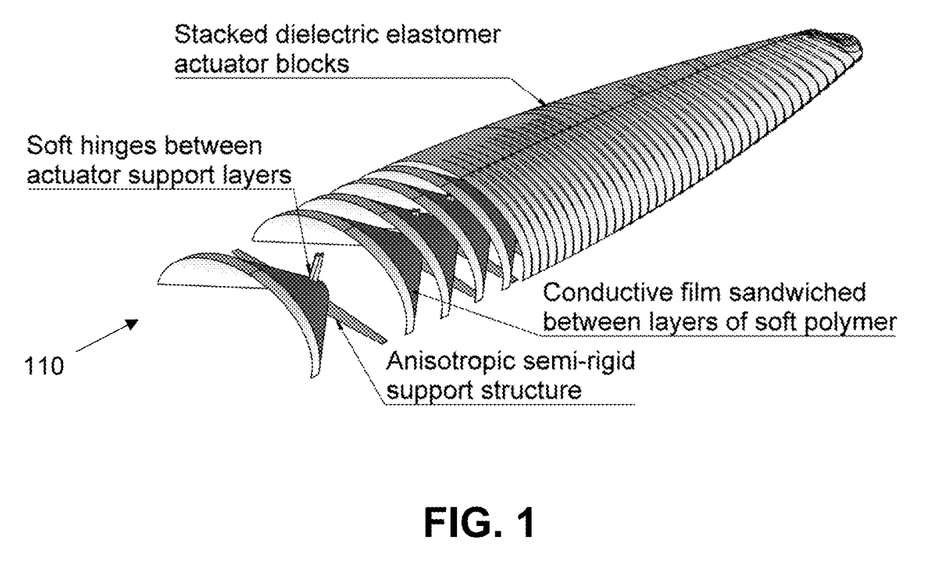
FIG. 1 shows a schematic view of an exemplary underwater vehicle actuator system.
Figure 2:
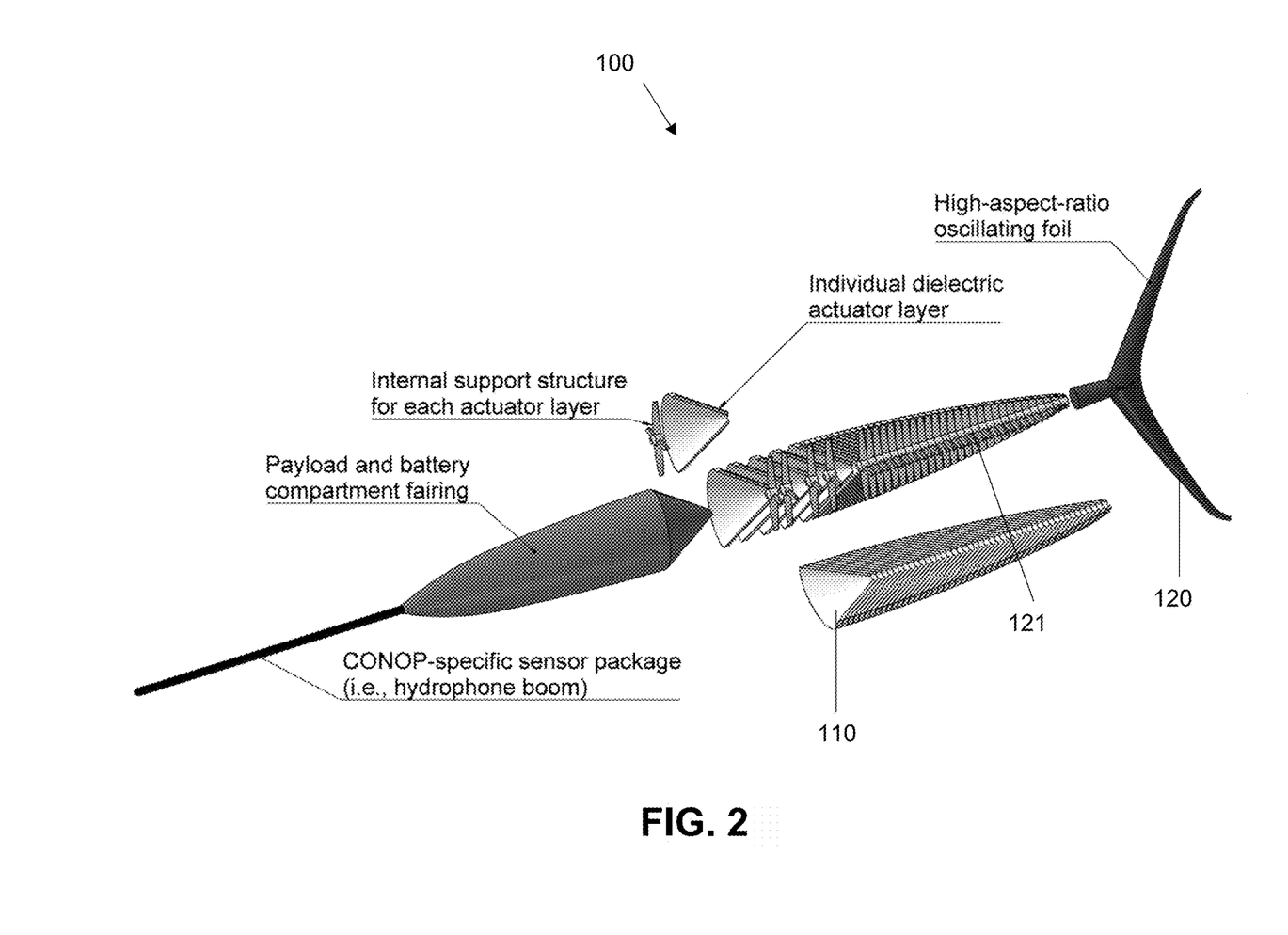
FIG. 2 shows a schematic broken-apart view of an exemplary underwater vehicle having an exemplary actuator system.
Figure 3:
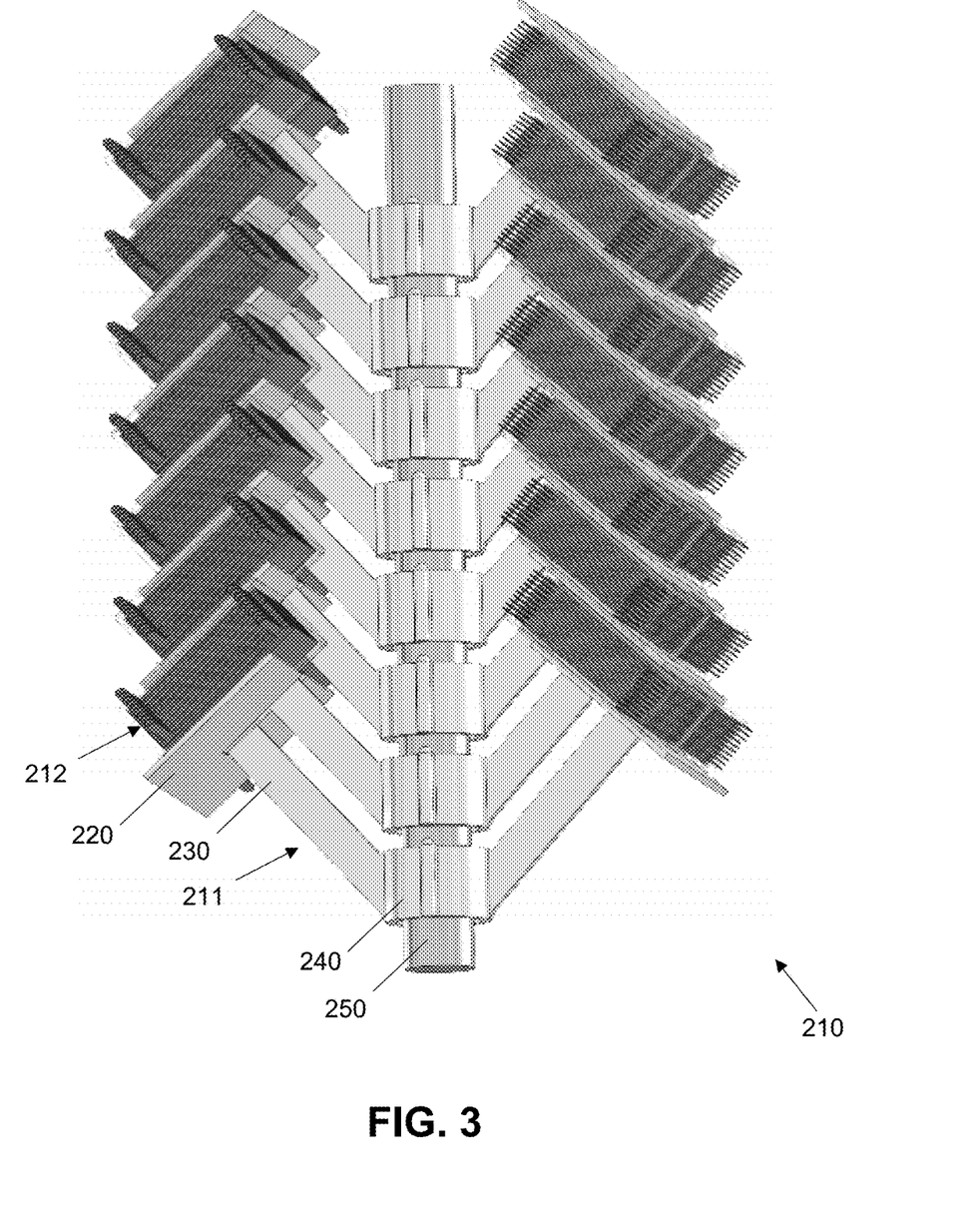
FIG. 3 shows an exemplary actuator system.
Figure 4:
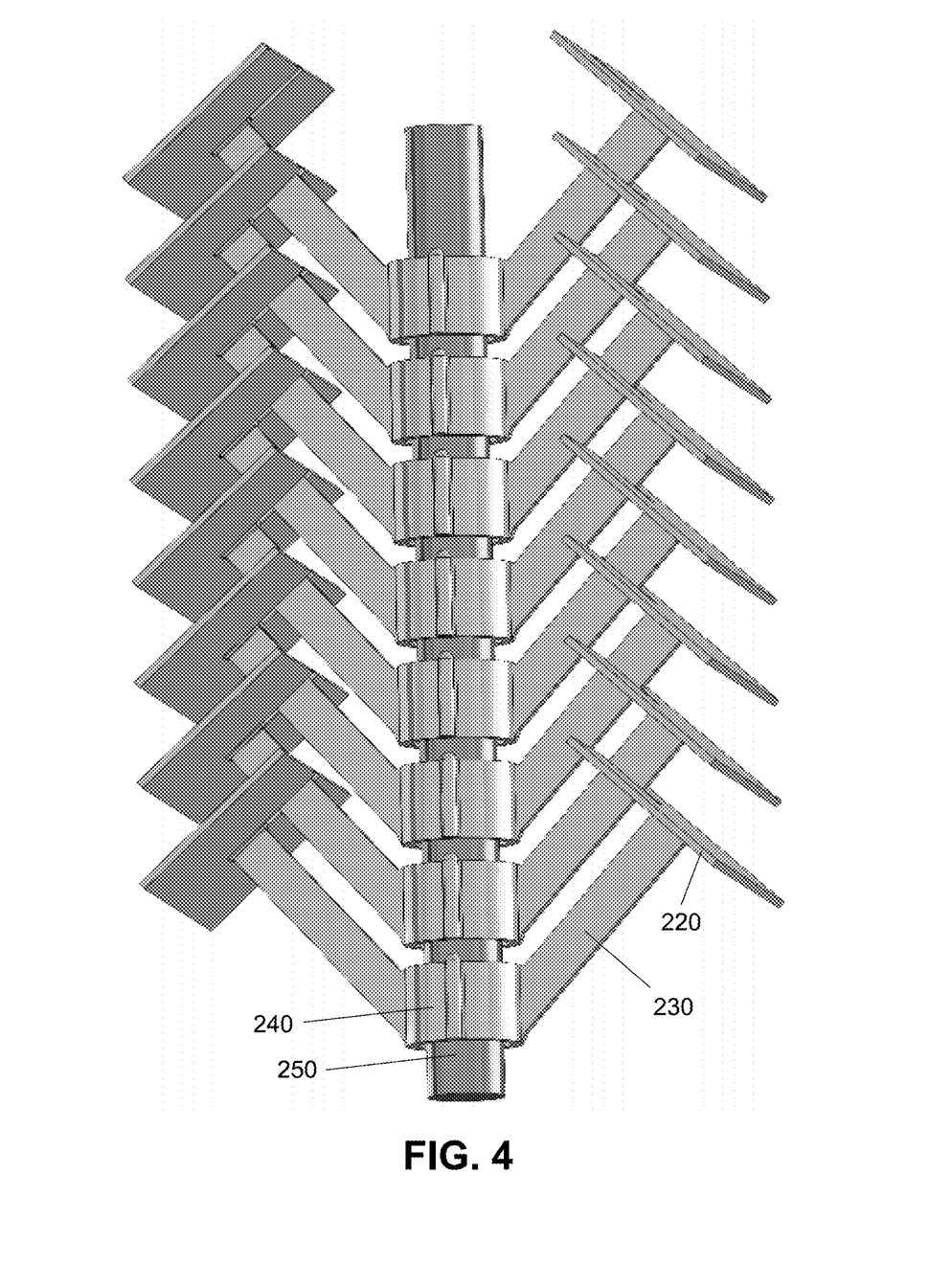
FIG. 4 shows an exemplary stack of skeletal mechanisms.
Figure 5:
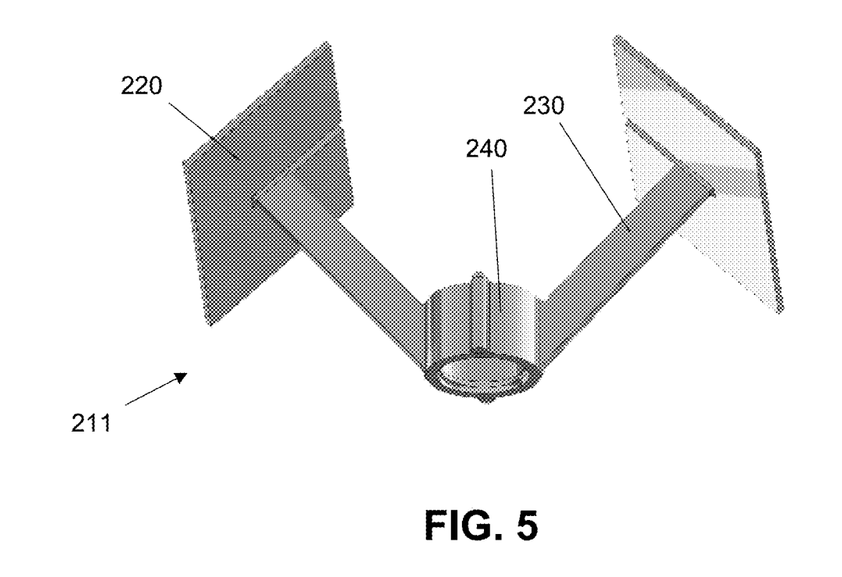
FIG. 5 shows an exemplary an exemplary skeletal mechanism.
Figure 6:
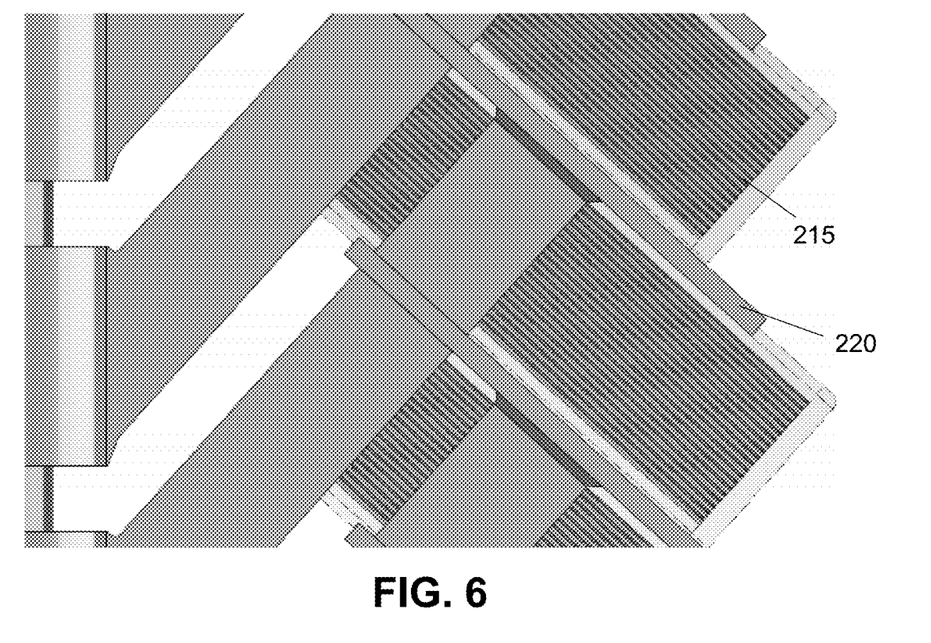
FIG. 6 shows a close-up see-through view of an exemplary actuator cassette.

As shown in FIGS. 1 and 2, an exemplary underwater vehicle platform 100 may take on an approximately Lancelet-like form and may be actuated by linearly contractile, soft artificial muscles 110. The artificial muscles may be arranged in a bio-inspired manner, consisting of stacked cones that contract along their axis and transmit tensile force to the oscillating foil 120 at the rear of the vehicle, through the spine 121 and elastic connections. This arrangement enables the additive contribution of force from each actuator layer to the oscillating foil. Low strain levels permit the use of dielectric elastomer actuators (DEAs). The geometry will also permit a fine level of shape control for active hydrodynamic management. A multi-channel arrangement allows for fine control of body shape-time history and introduces the potential for fine-scale hydrodynamic control using feedback from surface pressure sensors. This actuator layout permits the full replication of biological propulsion advantages—quieter and more efficient than reciprocating methods.

As shown in FIGS. 1 and 2, muscle layers 110 are arranged in overlapping, forward-facing cones with quadrilateral symmetry which is ideal for independent pitch and yaw axis control. The arrangement provides for inherent self-stabilization under tension.

Figure 7:
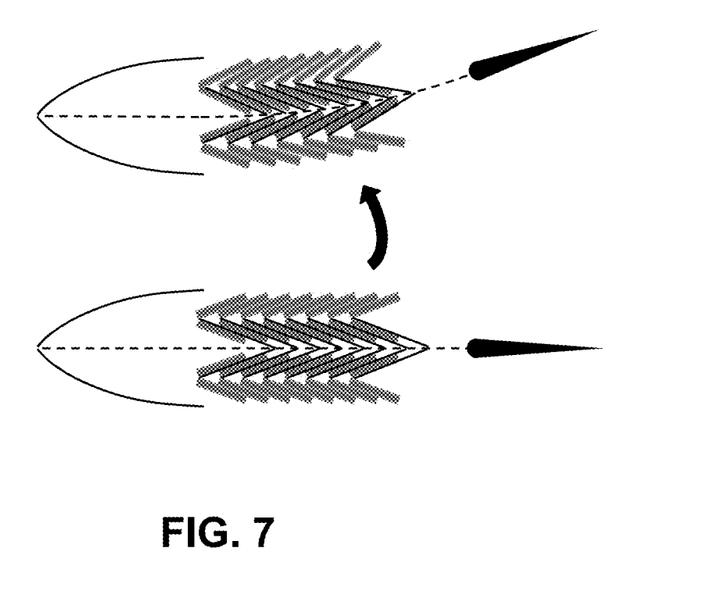
FIG. 7 shows a schematic showing movement in an exemplary actuator system.

As shown in FIG. 3-6, an exemplary vehicle includes a series of successive muscle layers 210 each having a skeletal mechanism 211 and a set of actuators 212. Preferably, actuators 212 are standardized actuator cassettes 212 (but may alternatively be, e.g., a muscle alloy or a pneumatic, hydraulic, or electro-mechanical actuator). Each cassette 212 comprises a stack of Dielectric Elastomer Actuator (DEA) layers 215. Each cassette 212 is situated between two actuator plates 220 of successive skeletal mechanisms, each actuator plate 220 substantially transverse to and linked (rigidly or rotatably) to an actuator arm 230. Each actuator arm 230 is linked (rigidly or rotatably) to a vertebra member 240 which preferably comprises a ring circumscribing a flexible chord member 250 running through successive vertebra members. Preferably, each skeletal member includes 2 or more (preferably 4) actuator arms disposed axially symmetrically about the chord member 250. The contraction of the DEA 215 transfers forces to the chord member 250 during locomotion, as shown in FIG. 7.

As mentioned above, DEA is the preferred choice for actuator because DEA's are the most mature artificial muscle technology. DEA's utilize electrostatic (Coulomb) force between two electrodes to compress a flexible dielectric layer. Using linear actuators and carangiform/thunniform swimming circumvents the main shortcoming with dielectric elastomers: low maximum strain. Because of the physical arrangement of the muscle layers 210, low maximum strain still results in relatively large displacement of the foil 120 at the end of the vehicle, similar to how muscles work in live tuna.

Figure 8:
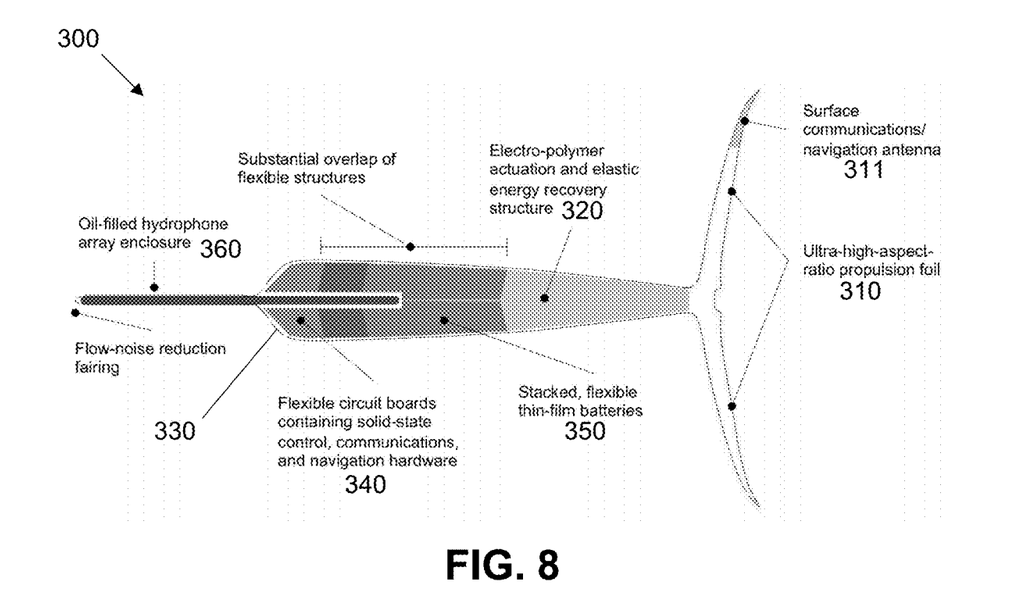
FIG. 8 shows an idealized schematic of an exemplary propulsion system integrated into an exemplary operational biomimetic soft-robot UUV, carrying a hydrophone array boom payload.

Turning now to FIG. 8, an exemplary vehicle 300 includes an oscillating foil 310 at a rear end of the vehicle and a plurality of muscle layers contained in an electro-polymer actuation and energy recovery structure 320. The muscle layers, as discussed above, additively transmit force to the foil 310, and are arranged in overlapping, forward-facing cones with quadrilateral symmetry, thereby providing independent pitch and yaw axis control and inherent self-stabilization under tension. Each muscle layer comprises linearly contractile, ductile artificial muscles, and preferably those muscles are DEAs. Preferably, the foil is an ultra-high-aspect-ratio propulsion foil, and may include one or more antennas 311 (preferably in an upper half of the foil).

In preferred embodiments, the vehicle 300 includes a plurality of surface pressure sensors 330 configured to provide feedback to a control unit 340. The control unit is configured to provide fine-scale hydrodynamic control using the feedback from the surface pressure sensors, and may be housed in or on one or more flexible circuit boards.

The vehicle 300 may also include a plurality of thin-film batteries 350 configured to provide power to the plurality of muscle layers and to any electronics in the vehicle.

Finally, the vehicle may include a forward projecting sensor package 360 such as an oil-filled hydrophone array enclosure for sensing the environment and reconnaissance and/or mapping purposes.

Exemplary long-range, autonomous acoustic sensor platforms have the following advantages:
1. Efficient biomimetic propulsion—Previous work has shown that thunniform propulsion can operate at up to 87 percent efficiency, while conventional, propeller-based propulsion is limited to approximately 40 percent. Adopting the 'pulse-and-glide' locomotion strategy employed by pelagic fishes will increase the distance traveled per unit energy even further.
2. Thunniform propulsion using soft-bodied actuation mechanisms will produce substantially less self-noise than hard reciprocating systems.
3. A soft-bodied UUV made from polymer materials will produce a smaller sonar cross-section as compared to a UUV equipped with pressure housings and rigid metallic propulsion systems.
4. The high efficiency and low self-noise characteristics of soft-bodied biomimetic propulsion will enable acoustic data collection at speeds in excess of those at which present-day UUV's operate, increasing the area surveyed per unit time.
5. The flexible, soft-bodied structure may be inherently pressure compensated, meaning that there may be no depth limit to the UUV's operational envelope.
6. Soft-bodied robots are extremely tough and are better able to withstand repeated impacts with the sea floor, a problem in shallow-water areas, under ice, or regions in which high-resolution bathymetric information is not available.
7. The biomimetic structure of the UUV is broadly similar to that of biologics that inhabit tropical and temperate seas, reducing the likelihood of detection through visual recognition.
8. The acoustic impedance of electro-polymer materials may be tunable. Actuator impedance that more closely matches that of water introduces the possibility of an acoustically transparent UUV.
9. While electro-polymers are a relatively new class of material, they are manufactured through an organic chemistry process. The cost of manufacture is likely to decrease substantially with economies of scale.
10. High level of control can be exerted on undulation mechanics.
11. Low levels of strain required for actuators, enabling fast response.
12. Reduced potential for cavitation at high speeds.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An underwater propulsion system comprising:
a central chord member; and
a series of successive muscle layers each having a skeletal mechanism and a set of actuators,
wherein each skeletal mechanism includes a central vertebra, two or more actuator arms extending radially outward from the central vertebra and disposed axially symmetrically about the central chord member, and an actuator plate extending from a radially outward end of each actuator arm and oriented substantially transverse to the actuator arm, and
wherein each actuator is situated between an actuator plate from a first muscle layer of the series and a second muscle layer of the series.

2. The underwater propulsion system of claim 1, wherein each actuator of the set of actuators comprises a standardized actuator cassette, each cassette including a stack of Dielectric Elastomer Actuator (DEA) layers.

3. The underwater propulsion system of claim 1, wherein the vertebra member includes a ring circumscribing the chord member and wherein the chord member runs through successive vertebra members.

4. The underwater propulsion system of claim 1, wherein each actuator arm is rigidly linked to a respective vertebra member.

5. The underwater propulsion system of claim 1, wherein each actuator arm is rotatably linked to a respective vertebra member.

6. The underwater propulsion system of claim 1, wherein each actuator arm is rigidly linked to a respective actuator plate.

7. The underwater propulsion system of claim 1, wherein each actuator arm is rotatably linked to a respective actuator plate.

8. An underwater vehicle comprising:
an oscillating foil at a rear end of the vehicle;
a plurality of muscle layers configured to additively transmit force to the foil, the plurality of muscle layers arranged in overlapping, forward-facing cones with quadrilateral symmetry, thereby providing independent pitch and yaw axis control and inherent self-stabilization under tension,
wherein each muscle layer comprises linearly contractile, ductile artificial muscles.

9. The underwater vehicle of claim 8, wherein the artificial muscles comprise dielectric elastomer actuators.

10. The underwater vehicle of claim 8, further comprising a plurality of surface pressure sensors configured to provide feedback to a control unit, the control unit configured to provide fine-scale hydrodynamic control using the feedback from the surface pressure sensors.

11. The underwater vehicle of claim 8, wherein the oscillating foil includes an antenna in an upper half of the foil.

12. The underwater vehicle of claim 8, further comprising flexible circuit boards containing one or more control units configured to control the vehicle.

13. The underwater vehicle further of claim 8, further comprising stacked, thin-film batteries configured to provide power to the plurality of muscle layers.

14. The underwater vehicle of claim 8, further comprising electro-polymer actuation and energy recovery structure.

15. The underwater vehicle of claim 8, further comprising a forward projecting sensor package.

16. The underwater vehicle of claim 8, wherein the oscillating foil is an ultra-high-aspect-ratio propulsion foil.

* * * * *